United States Patent [19]

Betts et al.

[11] Patent Number: 5,521,942

[45] Date of Patent: May 28, 1996

[54] METHOD FOR INCREASING THE DYNAMIC RANGE OF A SIGNAL IN A SIMULTANEOUS VOICE AND DATA SYSTEM BY THE USE OF OVERLAPPING SIGNAL POINT REGIONS AND TRELLIS CODING

[75] Inventors: William L. Betts, St. Petersburg; Gordon Bremer, Clearwater; Luke J. Smithwick, New Port Richey; Edward S. Zuranski, Largo, all of Fla.

[73] Assignee: AT&T Corp., Murray Hill, N.J.

[21] Appl. No.: 76,507

[22] Filed: Jun. 14, 1993

[51] Int. Cl.$^6$ .......................... H04L 27/04; H04L 23/02; H04L 5/12; G06F 11/10

[52] U.S. Cl. .................. 375/295; 375/265; 375/264; 375/261; 371/43

[58] Field of Search ............................ 375/265, 264, 375/295, 261, 286, 262; 371/43

[56] References Cited

U.S. PATENT DOCUMENTS

| 4,512,013 | 4/1985 | Nash et al. ........................ 370/69.1 |
| 4,534,040 | 8/1985 | Thapar ............................... 375/261 |
| 4,546,212 | 10/1985 | Crowder ............................ 179/2 C |
| 4,651,320 | 3/1987 | Thapar ............................... 375/261 |
| 4,672,602 | 6/1987 | Hargrave et al. ................. 370/58 |
| 4,757,495 | 7/1988 | Decker et al. ..................... 370/76 |
| 4,924,516 | 5/1990 | Bremer et al. ..................... 380/46 |
| 5,023,889 | 6/1991 | Divsalar et al. ................... 371/43 |
| 5,081,647 | 1/1992 | Bremer ................................ 375/5 |
| 5,103,227 | 4/1992 | Betts ................................... 341/61 |
| 5,243,629 | 9/1993 | Wei ..................................... 371/43 |

OTHER PUBLICATIONS

"Adaptive Equalization and Phase Tracking for Simultaneous Analog/Digital Data Transmission" by T. L. Lim and M. S. Mueller, The Bell System Technical Journal, vol. 60, No. 9, Nov. 1981, pp. 2039–2063, U.S.A.

"High–Speed Digital and Analog Parallel Transmission Technique Over Single Telephone Channel" by Fumio Akashi, Yoichi Sato and Mikiro Eguchi, IEEE Transactions On Communications, vol. Com. 30, No. 5, May 1982, pp. 1213–1218.

"Simultaneous Transmission on Speech and Data Using Code–Bearing Techniques", by R. Steele and D. Vitello, The Bell System Technical Journal, vol. 60, No. 9, pp. 2081–2105, Nov. 1981, USA.

"Adaptive Noise Cancelling: Principles and Applications" by Bernard Widrow, John R. Glover, Jr., John M. McCool, John Kaunitz, Charles S. Williams, Robert H. Hearn, James R. Zeidler, Eugene Dong, Jr., and Robert C. Goodlin, Proceedings of the IEEE, vol. 63, No. 12, Dec. 1975, USA.

(List continued on next page.)

Primary Examiner—Edward L. Coles, Sr.
Assistant Examiner—Allan A. Esposo
Attorney, Agent, or Firm—Joseph J. Opalach

[57] ABSTRACT

A communications system simultaneously transmits both a primary data signal and a secondary voice signal in such a way that the dynamic range of the secondary voice signal is increased even though deliberate errors are introduced into the transmitted data portion of the signal. In particular, the communications system includes an error correcting technique like channel encoding and the constellation signal space is divided into a number of regions, where at least one of the regions overlaps with another region. The primary signal is channel encoded to select a particular one of the number of regions, the region being represented by a reference signal point value. The voice signal is encoded to provide a signal point vector, which is added to the reference signal point in such a way that the resultant signal point is located in the overlapping region thereby deliberately introducing an error into the resulting transmitted signal point stream. Notwithstanding the deliberately introduced error, the channel encoding of the primary signal allows a receiver to recover the originally selected reference signal point value, which when subtracted from the received signal point value approximates the voice signal.

18 Claims, 4 Drawing Sheets

OTHER PUBLICATIONS

"An Integrated Digital Subscribers Speech and Data Service" by L. J. Stagg and D. Clothier, GEC Hirst Research Centre, Wembley, Middlesex, England and GEC Telecommunications Ltd., Coventry, England, pp. 39.6.1–39.6.6, London.

"Frequency Domain Data Transmission Using Reduced Computational Complexity Algorithms", by Abraham Peled and Antonio Ruiz, Computer Sciences Department, IBM T. J. Watson Research Center, IEE 1980, pp. 964–967, USA.

"Speech–band data modems" by P. F. Adams, IEE, 1980, pp. 733–736, USA.

"Speech and Data Transmission In ACS Telephone Channels" by V. E. Bukhviner, Telecommunication & Radio Eng., vol. 30/31, Jul. 1976.

"Method for Superimposing Data On Amplitude–Modulated Signals" Electronics Letters, 29 Apr. 1982, vol. 18, No. 9, pp. 379–381, USA.

"A New Generation of Speech Plus Data Multiplexer", by M. N. Y. Shum, N. A. Samuel and C. Laval, Computer and Systems Engineering Limited (Case), pp. 111–112, London.

METHOD FOR INCREASING THE DYNAMIC RANGE OF A SIGNAL IN A SIMULTANEOUS VOICE AND DATA SYSTEM BY THE USE OF OVERLAPPING SIGNAL POINT REGIONS AND TRELLIS CODING

BACKGROUND OF THE INVENTION

The present invention relates to data communications equipment, e.g., modems. In particular, this invention relates to the transmission of both voice and data signals over the same communications facility at the same time.

Generally speaking, a modem processes a data signal to provide a modulated signal for transmission over a communications channel, like the public switched telephone network (PSTN), to a far-end modem, or receiving modem. While any modulation scheme may be used to generate the modulated signal, typically the modulated signal is the result of quadrature amplitude modulation (QAM). This modulated signal represents a sequence of data symbols, where each data symbol is a selected signal point from a constellation signal space. In this approach, there is a predefined minimum spacing between data symbols. This minimum spacing, or separation, is directly related to the desired error margin of the data communications system. The desired error margin is the acceptable level of noise in the communications system. For example, when the modulated signal is received by the far-end modem, the value of each received signal point is typically different from the transmitted signal point values, each of which was associated with a data symbol. This change in the signal point value is the result of noise introduced by the communications channel. As a result, the receiving modem performs a "slicing" operation on each received signal point of the sequence. This slicing operation simply estimates the closest data symbol to the received signal point. This is also known as a "hard decision." As long as the noise from the communications channel is less than the acceptable error margin the receiving modem will always correctly estimate the transmitted data symbol.

However, when the noise from the communications channel is greater than the error margin, the receiving modem begins to make incorrect "hard decisions" about individual ones of the transmitted sequence of data symbols. An incorrect hard decision, or "hard error," occurs if an amount of noise greater than the error margin is added to a transmitted data symbol so that the received signal point is now closer to a data symbol that is different from the transmitted data symbol- with the result that the receiving modem erroneously picks the wrong data symbol. As a result, error correcting techniques are typically used to further encode the information so that the receiving modem can recover to an extent from any hard errors induced by the communications channel.

For example, one error correcting technique is a channel encoding scheme like trellis coding. Here, the transmitting modem selects data symbols not only as a function of the current value of the data signal in any time interval, but also as a function of antecedent values of the data signal. In other words, a trellis coding scheme is a form of convolutional code. As a result, the receiving modem not only performs a slicing operation but also executes a channel decoding operation. In particular, the receiving modem not only makes a hard decision for each received signal point, but also looks at antecedent hard decisions in order to estimate the current data symbol. The number of data symbols stored before making a decision about a particular data symbol is typically referred to as the "decoding depth." Overall, channel encoding techniques allow data communications to occur notwithstanding the fact that the noise from the communications channel is greater than the allowable error margin.

The co-pending, commonly assigned, U.S. patent application of Gordon Bremer and Kenneth D. Ko entitled "Simultaneous Analog and Digital Communication," serial No. XXXXX, filed on XXXXX, discloses a simultaneous voice and data communication system in which a representation of a voice signal, or second signal, is added to each data symbol for transmission over a communications channel to a receiving modem. In particular, the data symbol is a reference signal point value to which is added a voice signal vector, which represents the voice signal. The addition of the voice signal vector to the data symbol results in a signal point being selected that is a function of both the selected data symbol and the size of the voice signal vector.

The selected signal point is taken from a constellation signal space that is divided into a number of non-overlapping regions, each region being associated with a data symbol. Consequently, any signal point value within a region may be validly selected for transmission to a receiving modem. Since each signal point region is non-overlapping, the voice signal vector is constrained to be of a certain maximum size, or dynamic range, so that the selected signal point for transmission always lies within the selected region, which is determined by the selected data symbol.

Unfortunately, the quality of the transmitted voice signal is directly related to the allowable dynamic range of the voice signal vector. Consequently, any restriction on the dynamic range also limits the ability to improve the quality of any voice transmission.

SUMMARY OF THE INVENTION

Therefore, and in accordance with the invention, in a communications system that includes error correcting techniques, the size of at least one of the regions of signal space is expanded in such a way that the region overlaps with another region of signal space. As a result, the dynamic range of the voice signal, or second signal is increased, which thereby improves the transmission quality of the second signal.

When a signal point from an overlapping area of two regions is selected for transmission, an intentional error is introduced into the data symbol stream in such a way that a receiver will likely make a hard error in estimating the transmitted data symbol. However, we have realized that the error correcting technique that underlies the selection of data symbols allows the receiver to identify the correct region of the signal space and thereby allows recovery of the data signal and voice signal notwithstanding the fact that hard errors have been made by the receiver because of the apparent noise (which is the voice signal) on the received data signal.

In an embodiment of the invention, a simultaneous voice and data system comprises a modem that utilizes a trellis code for selecting one of a number of data symbols, where each data symbol is identified with a particular signal point taken from a constellation of signal points. This constellation of signal points is divided into a number of regions, where each region includes a portion of the constellation signal space and one of the above-mentioned dam symbols.

In addition, each region overlaps with a portion of each adjacent region. In particular, the regions of the signal space overlap so that the dynamic range of the voice signal is increased by 3 dB.

DETAILED DESCRIPTION

Figure 1:
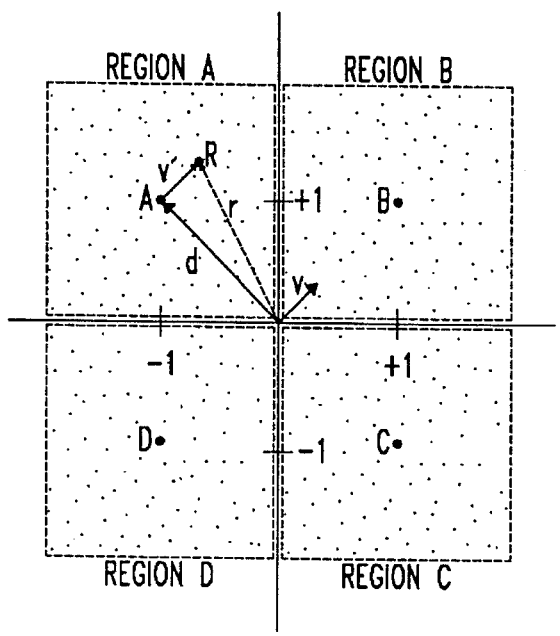
FIG. 1 shows an illustrative non-overlapping signal point constellation for use in a simultaneous voice and data communications system.

The above-mentioned co-pending patent application of Gordon Bremer and Kenneth D. Ko, which is hereby incorporated by reference, discloses a transmitter in which the transmitted signal represents a sequence of N-dimensional signal points, where each signal point is a function of at least two separate signals. Illustratively, one of these signals is an analog, or voice signal, and the other signal is a data signal. An illustrative 4-QAM symbol constellation for use in the simultaneous voice and data system disclosed in the above-mentioned co-pending patent application is shown in FIG. 1. As described in this co-pending patent application, a data signal is first encoded in each signaling interval, T, to select one of four non-overlapping regions of a signal space constellation, each region represented by one of the reference symbols "A," "B," "C," and "D." For example, the symbol "A" represents region 1, and in particular is associated with the signal point represented by the signal space coordinates (−1, +1), which represents the "in-phase" and "quadrature" components as is known in the art. In a prior art data-only communications system, a transmitter only transmits one of the four symbols selected from this symbol constellation. In other words, there are only four valid signal point coordinates that can be transmitted. However, as disclosed in the co-pending application of Gordon Bremer and Kenneth D. Ko, another signal, e.g., a voice signal, is added to the selected data symbol, with the result that any signal point within a chosen region is selected for transmission. Each valid region is associated with a different data symbol. For example, in every signaling interval, T, the voice signal is processed in such a way to provide two samples of the voice signal. These two samples are used to create a "voice signal vector" in the constellation signal space, e.g., the voice signal vector v shown in FIG. 1. In other words, the two samples of the voice signal, every signaling interval, select a signal point about the origin of the signal point constellation. The coordinates of this signal point define the magnitude and angle of the voice signal vector v from the origin of the signal point constellation. This voice signal vector is then added, i.e., by vector addition, to a data vector, d, which represents the selected data symbol in each signaling interval, T. The resultant vector, r, selects a particular signal point, R, for transmission from the selected region. As can be observed from FIG. 1, the magnitude of the voice signal vector v is constrained so that the resulting signal point, R, lies within a region. Consequently, upon reception of the transmitted signal point, a receiver simply makes a "hard decision" as described above as to what symbol was transmitted and then subtracts the signal point value of that symbol from the received signal point to allow recovery of the voice signal. In particular, the receiver picks that region, represented by each of the signal point values of each data symbol, that is closest in distance to the received signal point value.

As shown in FIG. 1, in order for a receiver to make correct "hard decisions," each region of the signal space is required to be non-overlapping. The size of each non-overlapping region directly affects the dynamic range of the voice signal vector. Unfortunately, voice signals have a much larger dynamic amplitude range and have an amplitude probability distribution heavily weighted toward zero, i.e., voice is mostly very small in amplitude with only occasional bursts to near full scale. As such, any limitation on the dynamic range of the voice signal vector directly affects the quality of voice transmission.

Therefore, and in accordance with the invention, in a communications system that includes error correcting techniques, the size of at least one of the regions of signal space is expanded in such a way that the region overlaps with another region of signal space. As a result, the dynamic range of the voice signal vector is increased, which thereby improves the transmission quality of the voice signal. When a signal point from an overlapping area of two regions is selected for transmission, an intentional error is introduced into the data symbol stream in such a way that a receiver will likely make a hard error in estimating the transmitted data symbol. However, the error correcting technique that underlies the selection of data symbols allows the receiver to identify the correct region of the signal space and thereby allows recovery of the voice signal from the received signal point.

Figure 2:
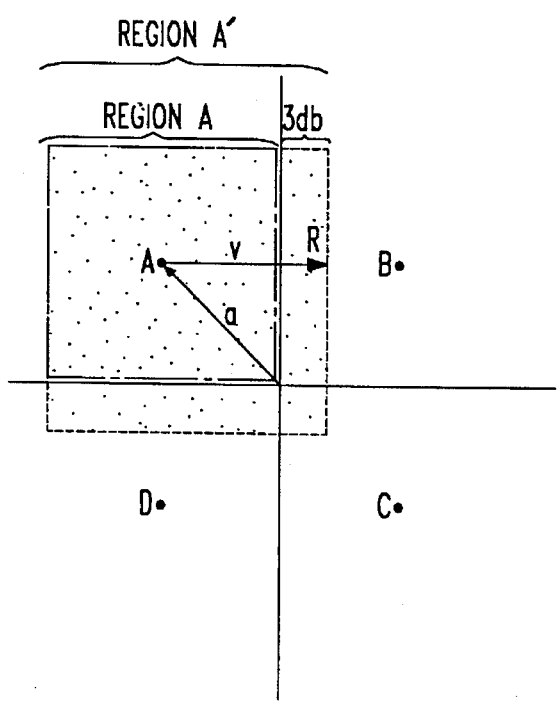
FIG. 2 illustrates a signal point constellation used in the transmitter of FIG. 3.

In particular, FIG. 2 shows an illustrative signal point constellation in which each of the regions overlaps to an extent with adjacent regions. The signal point constellation of FIG. 2 is constructed so that each region is expanded by 3 dB in any direction with the reference data symbol being illustratively located in the center of the region. By adding 3 dB more power to the voice signal vector, i.e., increasing the dynamic range of the signal, the transmission quality of the voice signal increases. For simplicity, only the expansion of the region about symbol A is shown in FIG. 2, each of the other regions about each symbol is similarly expanded 3 dB in every direction. Consequently, each of the valid signal point regions are: region$_{A'}$, region$_{B'}$, region$_{C'}$, and region$_{D'}$. It should be noted from FIG. 2 that with respect to a receiver, the definitions of the original regions still apply. For example, as shown in FIG. 2, if a voice vector v is added to symbol A, the resultant signal point r is taken from region'$_A$ with respect to the transmitter, but with respect to the receiver, it is taken from region$_B$. As a result, the receiver (discussed below) makes a hard error in estimating which symbol was transmitted since the resultant signal point R is closer to symbol B than symbol A.

Figure 3:
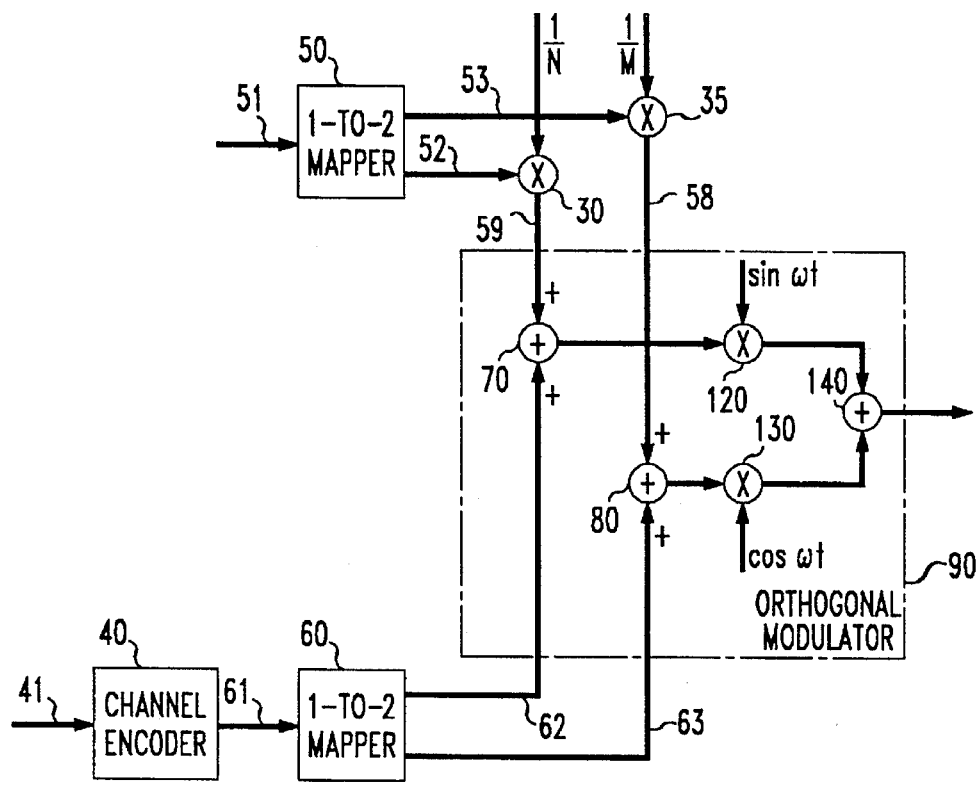
FIG. 3 shows a block diagram of a transmitter embodying the principles of the invention.

FIG. 3 depicts an arrangement that very basically illustrates the principles of this invention. It includes a channel encoder 40 responsive to digital signals applied on line 41. Channel encoder 40 operates in accordance with known encoding techniques and is illustratively a trellis encoder like that specified in the CCITT V.32 standard, or shown in other prior art, e.g., U.S. Pat. No. 4,941,154 issued Jul. 10, 1990 to L.-F. Wei. A trellis encoder is a form of convolutional code. In each signalling interval T, channel encoder 40 provides a data encoded digital signal to 1-to-2 dimensional mapper 60, which develops two output pulses on lines 62 and 63, each of which possesses an amplitude that relates to the encoded digital signals arriving on line 61. FIG. 3 also includes a 1-to-2 encoder 50 that responds to an applied voice signal on line 51, and it develops two analog signals on lines 52 and 53. The two analog signals on lines 52 and 53 represent samples of the voice signal and also provide the signal point coordinates for the voice signal vector in every signaling interval, T. Outputs 52 and 53 are applied to elements 30 and 35, respectively. Elements 30 and 35 scale the output of mapper 50 in such a way that the magnitude in each dimension is less than or equal to the magnitude of the vector, v, shown in FIG. 2. For the purposes of this example, since each region is square, the scalar values of both elements 30 and 35 are equal, i.e., N=M. Outputs 59 and 62 are combined in adder 70 and outputs 58 and 63 are combined in adder 80. The outputs of adders 70 and 80 form the components of the signals that are represented by the signal space of FIG. 2. The outputs of adders 70 and 80 are applied to modulators 120 and 130 and summed in adder 140 to form a modulated signal as is typically known in the art. Although not shown for simplicity, it should be noted that the outputs of adders 70 and 80 can be additionally processed by filters that are bandlimited to no more than $\omega$, in order to avoid aliasing, and to at least half the inverse of the output sample rate of mapper 60.

In FIG. 3 element 60 is depicted as a 1-to-2 mapper. However, it should be understood that element 50 can be an M-to-N mapper. That is, element 60 can be responsive to a plurality (M) of encoded digital signals and it can develop a different plurality (N) of output signals. Similarly, element 50 can be an M-to-K encoder that is responsive to a plurality of analog signals. Likewise, the collection of elements that follow elements 50 and 60 (i.e., elements 70, 80, 120, 130 and 140), which form orthogonal modulator 90 can be constructed to be responsive to the plurality of outputs of elements 50 and 60. More specifically, those elements must account for all of the applied input signals, and that means that they must be able to handle K or N signals, whichever is larger. In such a circumstance, however, the user can assume that the larger of the two (K or N) is the dimensionality of the system, and some of the dimensions have either no digital data, or no analog data, whichever applies. Of course, if there are "dimensions" for which there is no digital or analog data, other information can be sent over those dimensions, such as equalization "side" information.

In the context of a signal space, the N pluralities of output signals of elements 50 and 60 (assuming N is larger than K) correspond to the collection of components of vectors in multi-dimensional space; e.g., N-dimensional space. The coordinates of this multi-dimensional space correspond to the orthogonal modulation signals within orthogonal modulator 90. In FIG. 3, the two orthogonal modulation signals are cos $\omega$t and sin $\omega$t, but other modulation signals are also possible. For example, code division multiplexing (CDMA) templates. For purposes of this invention, orthogonal modulation signals are modulation signals that develop a transmitted signal comprising concurrent element signals and yet allow the receiver to separate the received signal into its constituent element signals, those being the signals developed in response to each of the modulation signals. It may also be observed that, relative to FIG. 2, orthogonal modulator 90 performs vector summation of the symbol vector represented by the components developed by element 60 with the analog information vector represented by the components developed by element 50. This is depicted in FIG. 2.

As described above, although the arrangement of FIG. 3 allows intentional errors to be introduced into the transmitted data signal in such a way that the receiver will likely make hard errors, the underlying error correcting technique, in this example a trellis code, allows a receiver to recover the original sequence of data symbols selected for transmission by performing the channel decoding process. In other words, the dynamic range of the voice signal is increased beyond the above-mentioned error margin even though this occasionally introduces deliberate errors into the communications system.

Figure 4:
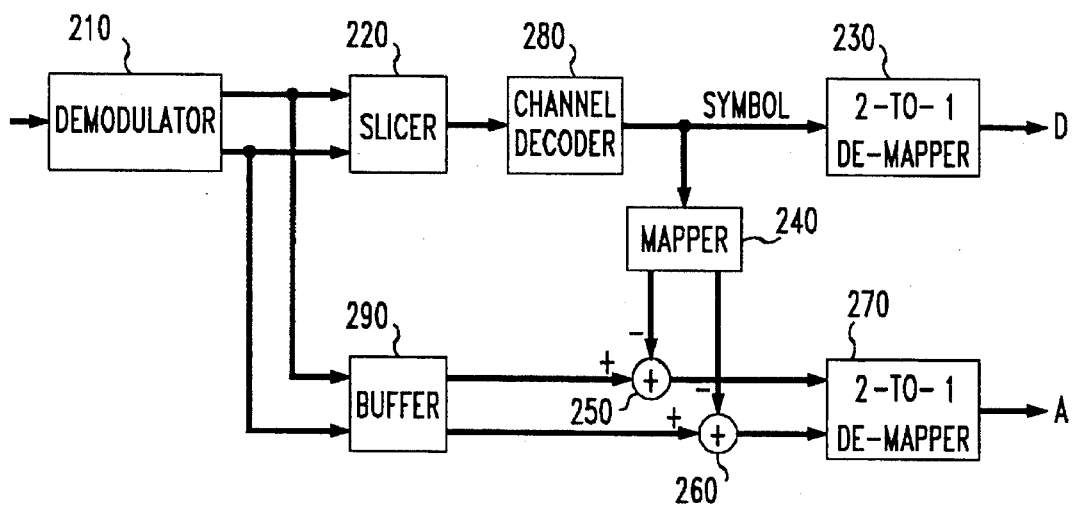
FIG. 4 shows a block diagram of a receiver, which receives the transmitted signal from the transmitter of FIG. 3.

FIG. 4 presents a basic block diagram of a receiver in conformance with the principles of this invention. The modulated input signal received from the channel is applied to demodulator 210 which develops the in-phase and quadrature components. Those are applied to slicer 220 which calculates an "error metric" or "transition metric" for each of the data symbols from the constellation of FIG. 2. This error metric is simply the distance the received signal point is from each data symbol. Slicer 220 provides the error metric for each of the data symbols to channel decoder 280, which is illustratively a Viterbi decoder as is known in the art. Generally speaking, channel decoder 280 adds each transition metric to a stored "path metric" for each state of the trellis code and then selects a new path metric for each trellis code state. Each new path metric has the smallest sum of error metrics. In other words, channel decoder 280 estimates a received data symbol sequence before deciding on a particular data symbol in order to minimize the overall errors in the entire received symbol sequence. For example, as described above and shown in FIG. 2, upon receiving signal point R, a hard decision would result in selecting data symbol B. However, this is a hard error since for that one received data symbol the corresponding error metric is the smallest when compared to the error metrics for the remaining data symbols, and by itself leads to selecting the wrong data symbol. In other words, the voice signal vector v was added to symbol A in such a way that the receiver made a hard error in determining the received symbol. However, channel decoder 280 allows the receiver to recover from, or avoid, this hard error because of the underlying trellis code that was used to select each one of the data symbols for transmission. Consequently, channel decoder 280 provides the corrected data symbol, i.e., symbol A to de-mapper 230 a number of symbol intervals latter, where the number of symbol intervals is typically equal to the decoding depth.

In order to recover the voice signal, FIG. 4 includes buffer 290, which receives the outputs from demodulator 210 and provides a time delay that allows for the trellis decoding to be completed first in channel decoder 280. FIG. 4 includes a 1-to-2 mapper 240 that is responsive to the symbols developed by channel decoder 280. The output of mapper 240 is the set of in-phase and quadrature components (that are applied in the FIG. 3 arrangement to elements 70 and 80). The outputs of mapper 240 are subtracted from the outputs of buffer 290 in subtractors 250 and 260. The outputs of subtractors 250 and 260 are applied to 2-to-1 de-mapper 270 which recombines the voice samples to form the original voice signal. De-mapper 270 performs the inverse function of mapper 50.

Figure 5:
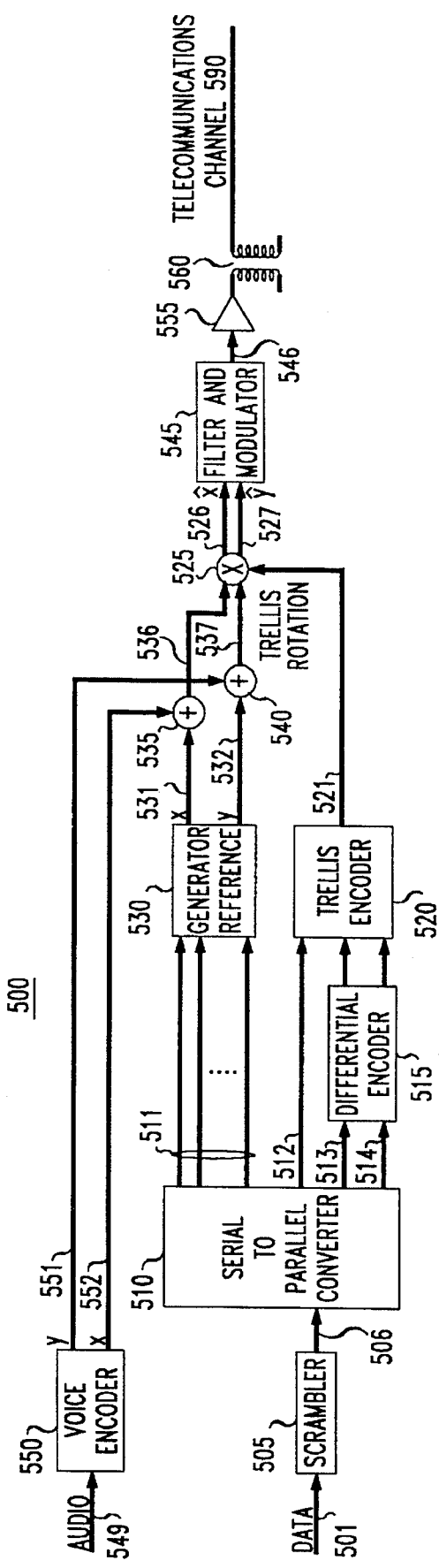
FIG. 5 shows a block diagram of another transmitter embodying the principles of the invention.
Figure 6:
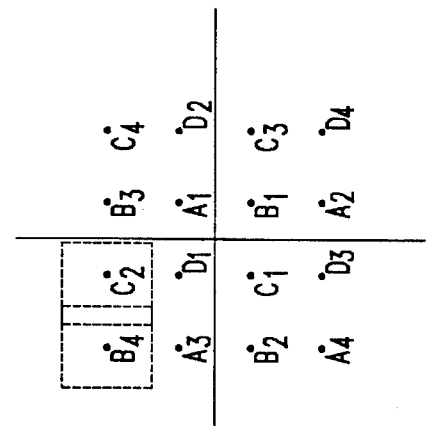
FIG. 6 illustrates a signal point constellation for use in the transmitter of FIG. 5.

Another transmitter embodying the principles of the invention is shown in FIG. 5 and illustratively uses the signal point constellation shown in FIG. 6. This signal space comprises four subsets of symbols: A, B, C, and D, where each subset includes four data symbols. For example, subset A includes the data symbols: $A_1$, $A_2$, $A_3$, and $A_4$. As can be seen from FIG. 6, and in accordance with the invention, the region of the signal space associated with data symbol $B_4$ overlaps with the region of signal space associated with data symbol $C_2$. Although, not shown, it is assumed that each of the other regions of signal space that are associated with the remaining data symbols also overlap.

Transmitter 500, of FIG. 5, accepts input digital data from line 501 and an analog speech signal from line 549. The data signal 501 is randomized by scrambler 505 then converted from serial to parallel digital data form in converter 510. The parallel data bits are in 2 groups, those that are not trellis encoded on paths 511 and those to be trellis encoded on paths 512, 513, and 514. Two of the trellis encoded bits, those represented by signals on paths 513 and 514 are first differentially encoded by encoder 515 and then trellis encoded by trellis encoder 520. Trellis encoder 520 is illustratively of the Wei type that is conventionally used. The output 521 of trellis encoder 520 is a rotation command, which is implemented by coordinate rotation element 525. The trellis encoding identifies which of four subsets is to be encoded from the constellation shown in FIG. 6, i.e., a "base subset." Each of the subsets A, B, C, and D use rotations of 0, −90, 180, and 90 degrees respectively. As is known in the art, this rotation has a value of providing differential encoding, which avoids phase ambiguity.

The unencoded dam bits on paths 511 are an address, which is applied to reference generator 530, which is illustratively a simple look-up table. The same table 530 is also be used in the receiver (discussed below) to reduce total memory requirements. The output 531 from look-up table 530 is a pair of cartesian coordinates identifying which subset point, e.g., $A_1$, $A_2$, $A_3$, or $A_4$, is to be sent (also known as quadrant encoding). Ignoring for the moment the voice signal, the identified subset point is then rotated in rotation device 525 to select a point from the constellation shown in FIG. 6. For example, if $A_3$ is identified by generator reference 530 and the base subset provided by trellis encoder 520 is D, the resulting data symbol selected for transmission is $D_3$.

The voice signal is encoded in voice encoder 550 as described above, i.e., in every signaling interval, T, two voice samples are provided on lines 551 and 552. These voice samples define the coordinates of a voice signal point, which further defines the magnitude and phase of a voice signal vector. It is assumed that voice encoder 550 limits the magnitude of each voice signal vector in accordance with the size of each region shown in FIG. 6. Each coordinate of the voice signal point is added to the respective coordinate of the selected subset point by adders 535 and 540. The coordinates of the resultant signal point are provided by lines 536 and 537 to rotation device 525. The latter, as described above, rotates the resultant signal point as a function of the selected base subset provided by trellis encoder 520 to provide the coordinates of the final signal point via signals lines 526 and 527. The signal representing the final signal point is transmitted over telecommunications channel 590 via filter and modulator 545, amplifier 555 and coupler 560.

Figure 7:
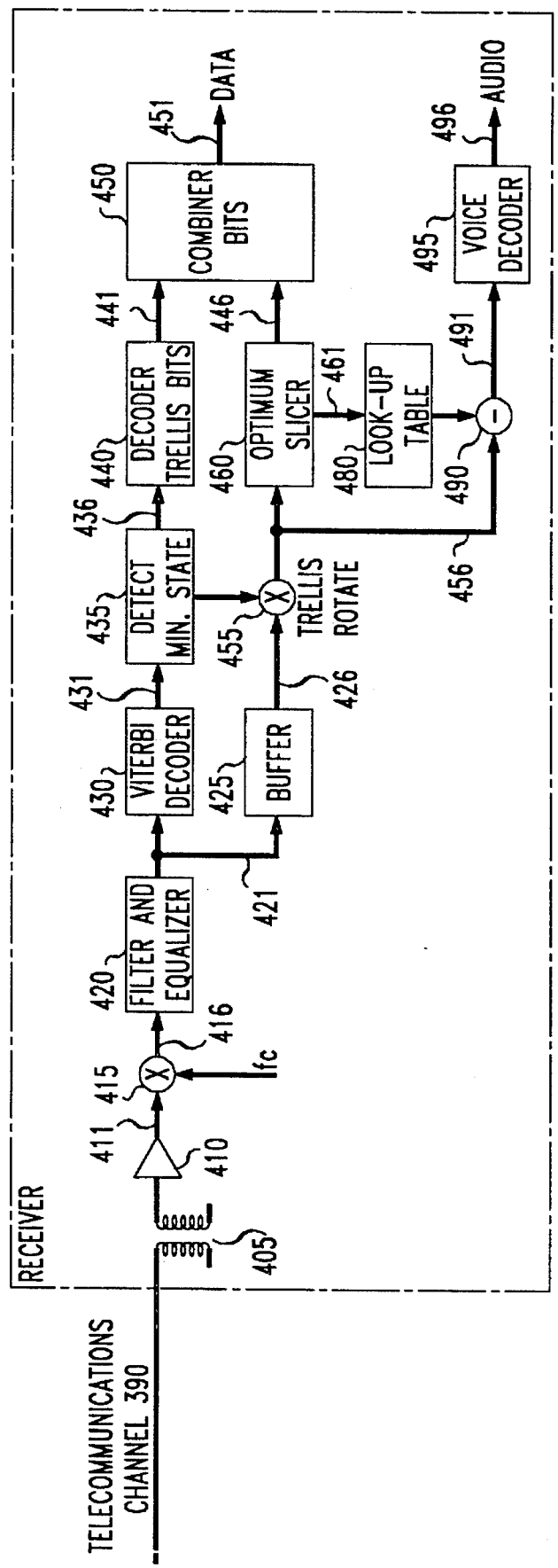
FIG. 7 shows a block diagram of a receiver, which receives the transmitted signal from the transmitter of FIG. 5.

The network 590 terminates in receiver 400, which is shown in FIG. 7. Receiver 400 is coupled to the network by coupler 405, and amplifier 410. Using conventional digital signal processing (DSP) technology, demodulator 415 demodulates the signal from its carder frequency $f_c$ for baseband processing in filter and equalizer 420.

The equalized output from filter and equalizer 420 is delayed in buffer 425 before processing. This delay allows for trellis decoding to be completed first in Viterbi decoder 430. The output of the Viterbi decoder at any symbol time is delayed by typically 16 or more trellis code symbols. For a four dimensional trellis code this is 32 or more modulated symbols. The output from Viterbi decoder 430 is the decoded and error corrected trellis state. Minimum State Detector 435 identifies the state with the smallest error metric with an accuracy that is 3 to 4 dB better than an uncoded system. As is known in the art the minimum state identifies the decoded trellis bits in device 440. These bits are generally known as the coded bits and are provided on line 441. The coded bits are combined with the uncoded bits provided on line 446 in bit combiner 450. The combined data bit stream is then processed by conventional methods to produce the output digital data stream on line 451. The uncoded bits are recovered by the second path via buffer 425 (discussed below).

Minimum state detector 435 also provides a signal identifying the trellis rotation to trellis rotator 455 corresponding to rotator 525 used in transmitter 500. Thus, the delayed output from buffer 425 is rotated back to the original reference system by rotator 455. In this original reference system the output signal on line 456 is decoded by optimum slicer 460. The output of slicer 460 is an index provided by a signal on line 461 and the uncoded bits on line 446, which are combined with the coded bits in bit combiner 450 as previously described.

The index provided by the signal on line 461 provides the ideal reference for the decoded subset point. The ideal references are store in look-up table 480. The ideal references are subtracted from the trellis rotator output signal by subtractor 490. This removes the primary data modulation from the subset output. The original voice encoded signal on line 491, i.e., the coordinates of the voice sample, is decoded by voice decoder 495, described above, to provide the voice signal on line 496.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, although the invention is illustrated herein as being implemented with discrete functional building blocks, e.g., slicer 220, etc., the functions of any one or more of those building blocks can be carded out using one or more appropriate programmed processors. In addition, the concept of overlapping regions of signal points can be implemented in any data communications system employing error correcting techniques and that includes communications systems with fractional bit rates. Also, other forms of error correcting codes may be used, e.g., transform encoding etc.

We claim:

1. A method for transmitting comprising the steps of:
   encoding a first signal to provide a plurality of signal points, where each signal point is taken from an N-dimensional signal space, each signal point having coordinates that define a first signal vector about an origin of said signal space;
   trellis encoding and mapping a data signal to provide a sequence of data symbols, where each data symbol is associated with a particular one of a number of signal points of said signal space and where each particular one of the number of signal points is associated with a different one of a number of regions of said signal space, where at least two of the number of regions partially overlap to create an overlapping region;

adding each one of the plurality of signal points to a respective data symbol from said sequence of data symbols to provide a sequence of resultant signal points such that at least one of the resultant signal points is taken from said overlapping region; and transmitting a resultant signal that represents the sequence of resultant signal points.

2. The method of claim 1 wherein N is two.

3. The method of claim 1 wherein the first signal is a voice signal.

4. The method for transmitting comprising the steps of:

encoding a first signal to provide a plurality of signal points, where each signal point is taken from an N-dimensional signal space, each signal point having coordinates that define a first signal vector about an origin of said signal space;

encoding a data signal to provide a first signal group and a second signal group that represent said data signal;

channel encoding the first signal group to provide a trellis encoded data signal;

selecting a data symbol every signaling interval T as a function of the trellis encoded data signal and the second signal group, where each selected data symbol is associated with a particular one of a number of signal points from said signal space and where each particular one of the number of signal points is associated with a different one of a number of regions of said signal space, where at least two of the number of regions partially overlap to create an overlapping region;

adding each one of the plurality of signal points to the selected data symbols in a respective signaling interval to provide a resultant signal point such that in at least one signaling interval the resultant signal point is taken from said overlapping region; and transmitting a signal that represents the resultant signal point.

5. The method of claim 4 wherein the channel encoding step is the step of trellis encoding.

6. The method of claim 4 wherein the first signal is a voice signal.

7. A method comprising the steps of:

channel encoding and mapping a data signal to select one of a number of data symbols, where each data symbol is associated with a different signal point taken from a N-dimensional signal space and where each data symbol is separated from adjacent data symbols by a distance, 2d, where the distance d is representative of an error margin that allows a receiver to discriminate between adjacent symbols;

encoding a first signal to provide a first signal point, where the first signal point is taken from the signal space, each signal point having coordinates that define a first signal vector about an origin of said signal space;

adding the first signal vector to the selected one of the number of data symbols to provide a resultant signal point is a distance m from the selected one the number of data symbols, where m>d; and transmitting a signal that represents the resultant signal point.

8. A method comprising the steps of:

dividing a data signal into to a first signal group and a second signal group in each signaling interval, T;

quadrant encoding the first signal group to provide a quadrant encoded data symbol in each signaling interval, T;

trellis encoding the second signal group to provide a trellis encoded data value in each signaling interval T;

encoding a voice signal to provide an encoded voice signal vector in each signaling interval T;

adding the encoded voice signal vector to the quadrant encoded data symbol to provide a voice and data signal point in each signaling interval T;

rotating the voice and data signal point according to the trellis encoded data value to select a resultant signal point in each signaling interval T, where at least one resultant signal point is from one of a number of overlapping signal point regions, transmitting a signal that represents each voice and data signal point occurring over the number of signaling intervals;

where each region overlaps a portion of at least one other region.

9. A method for transmitting comprising the steps of:

trellis encoding a data signal to provide a sequence of data symbols from an N-dimensional signal space over a number of signaling intervals, T, where each data symbol is associated with a particular one of a number of signal points of said signal space;

encoding a first signal over the number of signaling intervals, T, to provide a plurality of first signal points, where each first signal point is taken from said signal space;

adding each one of the plurality of first signal points to a respective one of the sequence of data symbols to provide a sequence of resulting signal points so that a distant receiver will make a hard error as to at least one data symbol from the sequence of data symbols; and transmitting a signal that represents the sequence of resultant signal points to the distant receiver.

10. Apparatus for transmitting comprising:

means for encoding a first signal to provide a plurality of signal points, where each signal point is taken from an N-dimensional signal space, each signal point having coordinates that define a first signal vector about an origin of said signal space;

means for trellis encoding and mapping a data signal to provide a sequence of data symbols, where each data symbol is associated with a particular one of a number of signal points of said signal space and where each particular one of the number of signal points is associated with a different one of a number of regions of said signal space, where at least two of the number of regions partially overlap to create an overlapping region with at least one of the adjacent regions;

means for adding each one of the plurality of signal points to a respective data symbol from said sequence of data symbols to provide a sequence of resultant signal points such that at least one of the resultant signal points is taken from said overlapping region; and means for transmitting a resultant signal that represents the sequence of resultant signal points.

11. The apparatus of claim 10 wherein N is two.

12. The apparatus of claim 10 wherein the first signal is a voice signal.

13. Apparatus for transmitting comprising:

means for encoding a first signal to provide a plurality of signal points, where each signal point is taken from an N-dimensional signal space, each signal point having coordinates that define a first signal vector about an origin of said signal space;

means for encoding a data signal to provide a first signal group and a second signal group that represent said data signal;

means for channel encoding the first signal group to provide a trellis encoded data signal;

means for selecting a data symbol every signaling interval T as a function of the trellis encoded data signal and the second signal group, where each selected data symbol is associated with a particular one of a number of signal points from said signal space and where each particular one of the number of signal points is associated with a different one of a number of regions of said signal space, where at least two of the number of regions partially overlap to create an overlapping region;

means for adding each one of the plurality of signal points to the selected data symbol in a respective signaling interval to provide a resultant signal point such that in at least one signaling interval the resultant signal point is taken from said overlapping region; and means for transmitting a signal that represents the resultant signal point.

14. The apparatus of claim 13 wherein the channel encoding means trellis encodes the respective portion of the data signal.

15. The apparatus of claim 14 wherein the first signal is a voice signal.

16. Apparatus comprising means for channel encoding and mapping a data signal every signal interval, T, to select one of a number of data symbols, where each data symbol is associated with a different signal point taken from an N-dimensional signal space and where each data symbol is separated from adjacent data symbols by a distance, 2d, where the distance d is representative of an error margin that allows a receiver to discriminate between adjacent symbols;

means for encoding a first signal every signaling interval to provide a first signal point, where the first signal point is taken from said signal space, each signal point having coordinates that define a first signal vector about an origin of said signal space;

means for adding the first signal vector to the selected one of the number of data symbols in each signaling interval, T to provide a resultant signal point such that at least one resultant signal point is a distance m, from the selected one of the number of data symbols, where m>d; and means for transmitting a signal that represents the resultant signal point occurring in every signaling interval, T.

17. Apparatus comprising:

means for dividing a data signal into a first signal group and a second signal group in each signaling interval, T;

means for quadrant encoding the first signal group to provide a quadrant encoded data symbol in each signaling interval, T;

means for trellis encoding the second signal group to provide a trellis encoded data value in each signaling interval T;

means for encoding a voice signal to provide an encoded voice signal vector in each signaling interval T;

means for adding the encoded voice signal vector to the quadrant encoded data symbol to provide a voice and data signal point in each signaling interval T;

means for rotating the voice and data signal point according to the trellis encoded data value to select a resultant signal point in each signaling interval T, where at least one resultant signal point is from one of a number of overlapping signal point regions, means for transmitting a signal that represents the resultant signal points occurring in each signal interval T.

18. Apparatus for transmitting comprising:

means for trellis encoding a data signal to provide a sequence of data symbols from an N-dimensional signal space over a number of signaling intervals, T, where each data symbol is associated with a particular one of a number of signal points of said signal space;

means for encoding a first signal over the number of signaling intervals, T, to provide a plurality of first signal points, where each first signal point is taken from the signal space;

means for adding each one of the plurality of first signal points to a respective one of the sequence of data symbols to provide a sequence of resulting signal points so that a distant receiver will make a hard error as to at least one data symbol from the sequence of data symbols; and means for transmitting a signal that represent the sequence of resultant signal points to the distant receiver.

* * * * *